(12) United States Patent
Oh et al.

(10) Patent No.: US 11,973,013 B2
(45) Date of Patent: Apr. 30, 2024

(54) INTERPOSER

(71) Applicant: AMOSENSE CO., LTD, Cheonan-si (KR)

(72) Inventors: Changwoo Oh, Anseong-si (KR); Gilseon Lee, Cheonan-si (KR); Jungkyun Shin, Cheonan-si (KR); Youngjun An, Cheonan-si (KR)

(73) Assignee: AMOSENSE CO., LTD, Cheonan-si (KR)

( * ) Notice: Subject to any disclaimer, the term of this patent is extended or adjusted under 35 U.S.C. 154(b) by 405 days.

(21) Appl. No.: 17/291,888

(22) PCT Filed: Nov. 4, 2019

(86) PCT No.: PCT/KR2019/014842
§ 371 (c)(1),
(2) Date: May 6, 2021

(87) PCT Pub. No.: WO2020/096309
PCT Pub. Date: May 14, 2020

(65) Prior Publication Data
US 2022/0005757 A1    Jan. 6, 2022

(30) Foreign Application Priority Data

Nov. 8, 2018   (KR) .................. 10-2018-0136854
Oct. 30, 2019  (KR) .................. 10-2019-0136682

(51) Int. Cl.
*H05K 1/14*       (2006.01)
*H01L 23/13*      (2006.01)
(Continued)

(52) U.S. Cl.
CPC ........ *H01L 23/49827* (2013.01); *H01L 23/13* (2013.01); *H01L 23/15* (2013.01);
(Continued)

(58) Field of Classification Search
CPC .................. H05K 1/145; H05K 1/218; H05K 2201/09609; H05K 2201/09954;
(Continued)

(56) References Cited

U.S. PATENT DOCUMENTS 6,738,249 B1 * 5/2004 Anthony ................. H01L 23/50
257/E23.079
8,115,283 B1 * 2/2012 Bolognia .............. B81B 7/0064
257/659
(Continued)

FOREIGN PATENT DOCUMENTS

KR   10-2007-0119186 A   12/2007
KR      10-1185858 B1     9/2012
(Continued)

OTHER PUBLICATIONS

Chinese Office Action dated Jan. 2, 2024 as received in application No. 201980086383.X.
(Continued)

*Primary Examiner* — Hoa C Nguyen
(74) *Attorney, Agent, or Firm* — Maschoff Brennan

(57) ABSTRACT

The present disclosure relates to an interposer. The interposer includes: a support body formed of a ceramic material, a connection electrode configured to the top surface and bottom surface of the support body, and a shielding member disposed at an outer surface of the support body. At least a part of the support body is disposed along the edge of a substrate, and electrically connects the substrate and a substrate. The interposer is formed of a ceramic material and thus make it possible to implement a fine pattern, to improve dimensional stability by preventing the bending deformation of ceramic green sheets, and to raise the reliability of signal transmission. Therefore, the interposer can contribute to
(Continued)

implementing high performance of an electronic device and reducing the size of the electronic device.

17 Claims, 15 Drawing Sheets

(51) Int. Cl.
    *H01L 23/15*     (2006.01)
    *H01L 23/498*     (2006.01)
    *H01L 23/552*     (2006.01)
    *H01L 23/66*     (2006.01)
    *H05K 9/00*     (2006.01)

(52) U.S. Cl.
    CPC ...... *H01L 23/49838* (2013.01); *H01L 23/552* (2013.01); *H01L 23/66* (2013.01); *H05K 1/145* (2013.01); *H01L 2223/6622* (2013.01); *H01L 2223/6666* (2013.01); *H01L 2223/6672* (2013.01); *H05K 9/0022* (2013.01); *H05K 2201/10378* (2013.01)

(58) Field of Classification Search
    CPC . H05K 2201/10378; H05K 2201/0707; H05K 9/0052; H05K 9/0088
    See application file for complete search history.

(56) References Cited

U.S. PATENT DOCUMENTS

| 10,121,774 | B2 | 11/2018 | Ko |
| 10,548,249 | B2 * | 1/2020 | Mokler .................. H05K 3/341 |
| 2004/0201111 | A1 | 10/2004 | Thurgood |
| 2005/0184381 | A1 | 8/2005 | Asahi et al. |
| 2012/0104629 | A1 | 5/2012 | Bolognia et al. |
| 2016/0079214 | A1 | 3/2016 | Caskey et al. |
| 2017/0287796 | A1 | 10/2017 | Lee et al. |
| 2019/0082535 | A1 * | 3/2019 | Myers ..................... H05K 1/11 |

FOREIGN PATENT DOCUMENTS

| KR | 10-2015-0009728 A | 1/2015 |
| KR | 10-2017-0016550 A | 2/2017 |
| KR | 10-2017-0112335 A | 10/2017 |

OTHER PUBLICATIONS

KR Office Action dated Feb. 7, 2024 as received in Applicaiton No. 10-2019-0136682.

* cited by examiner

[FIG. 1]
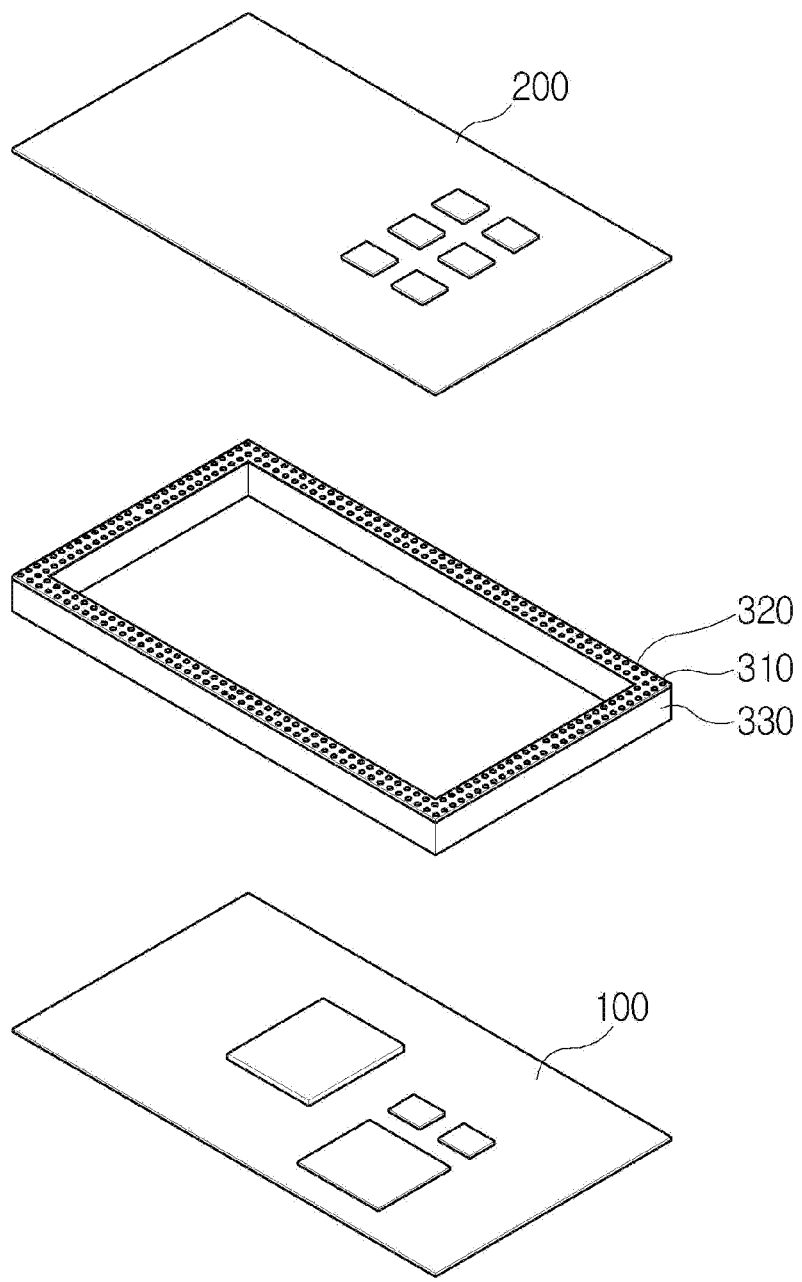

[FIG. 2A]
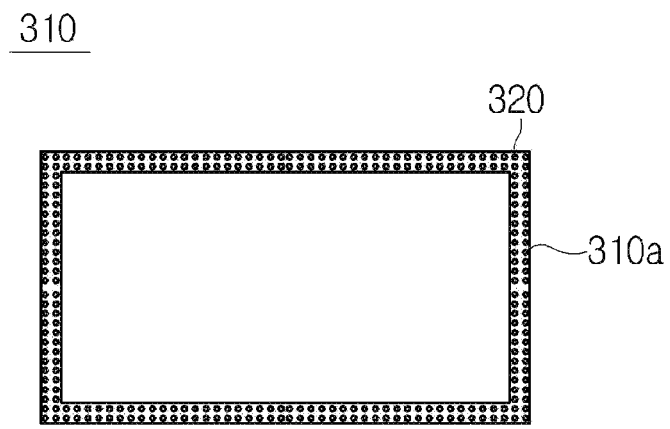
[FIG. 2B]
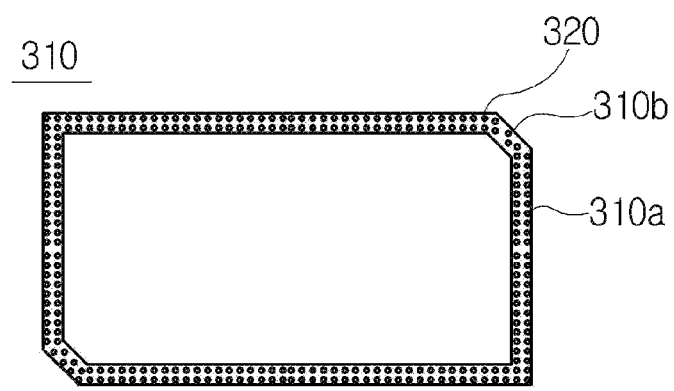

[FIG. 2C]
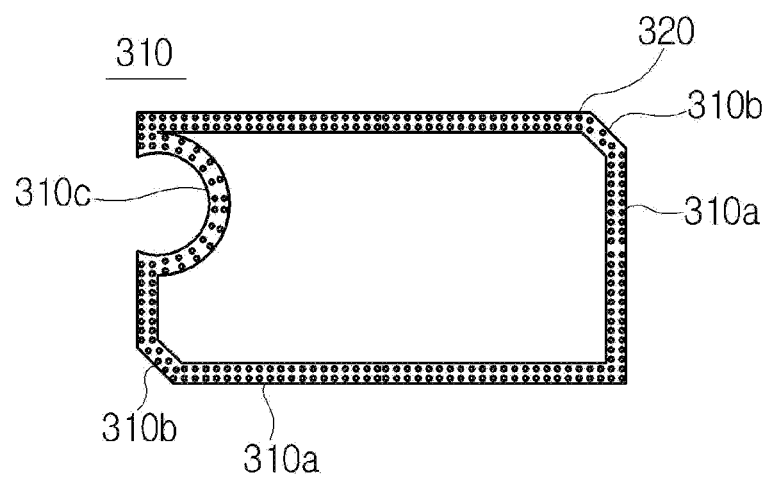

[FIG. 3A]
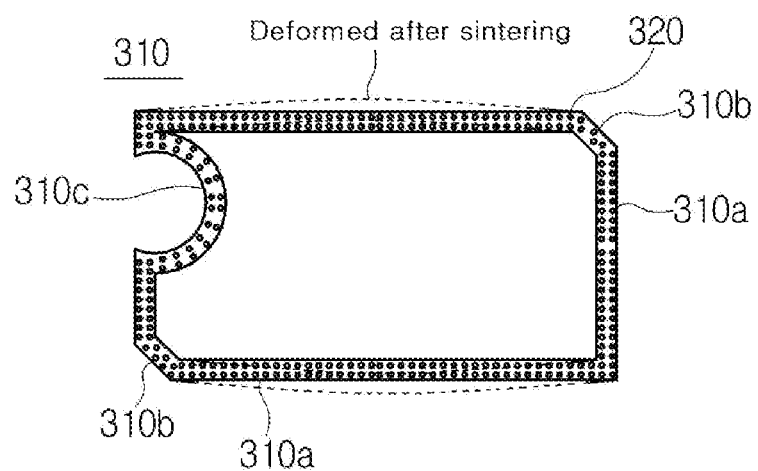
[FIG. 3B]
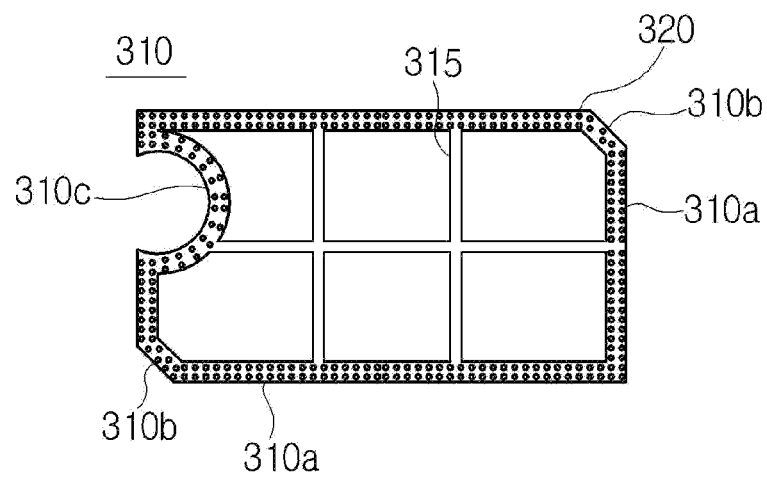

[FIG. 3C]
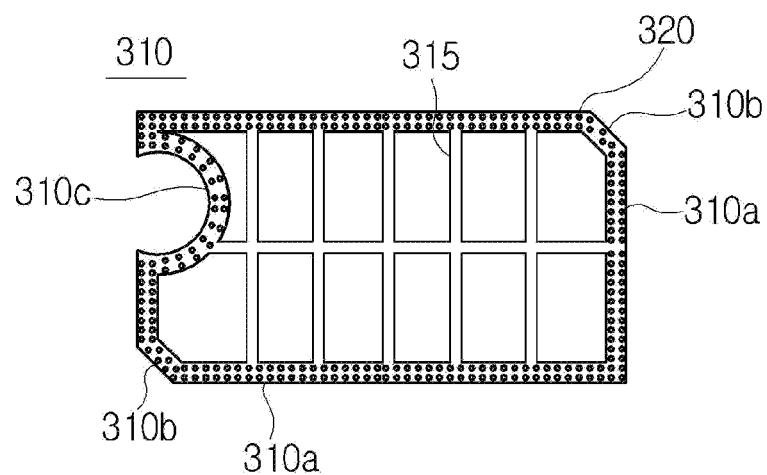
[FIG. 3D]
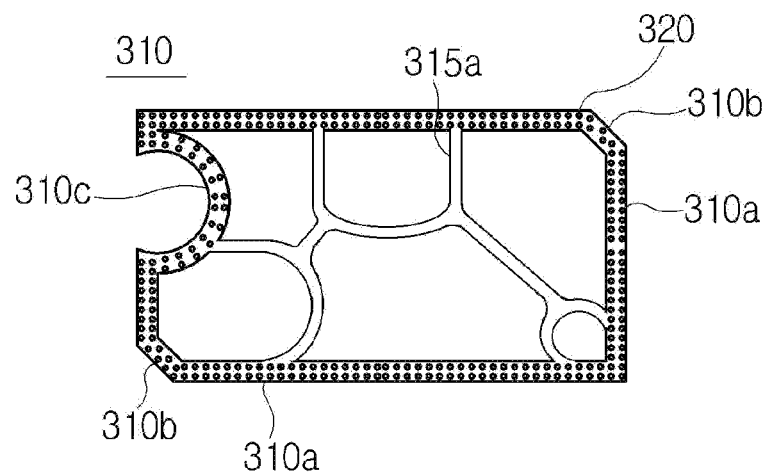

[FIG. 4]
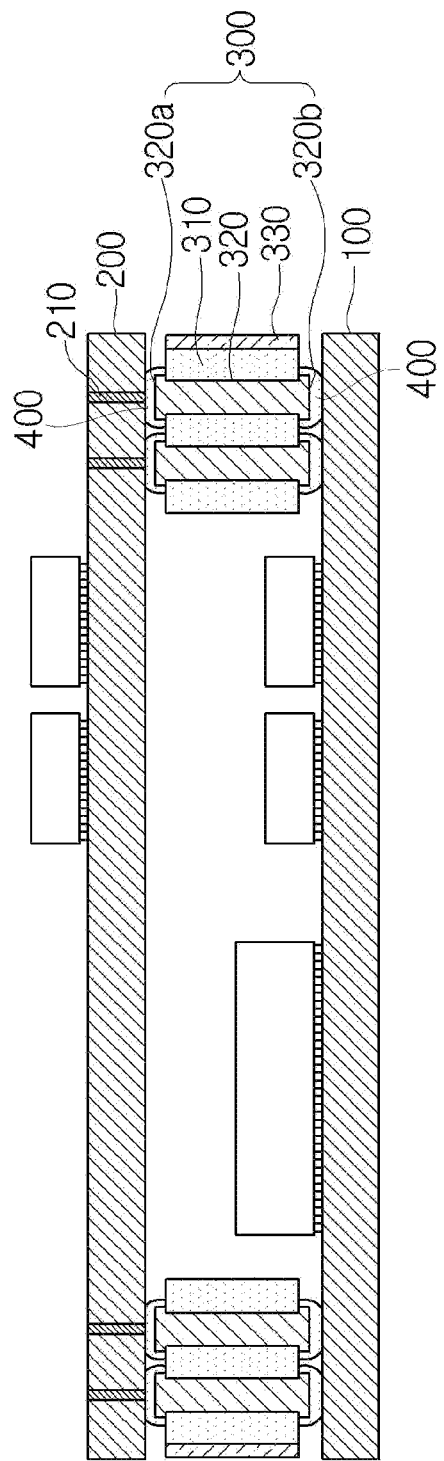

[FIG. 5]
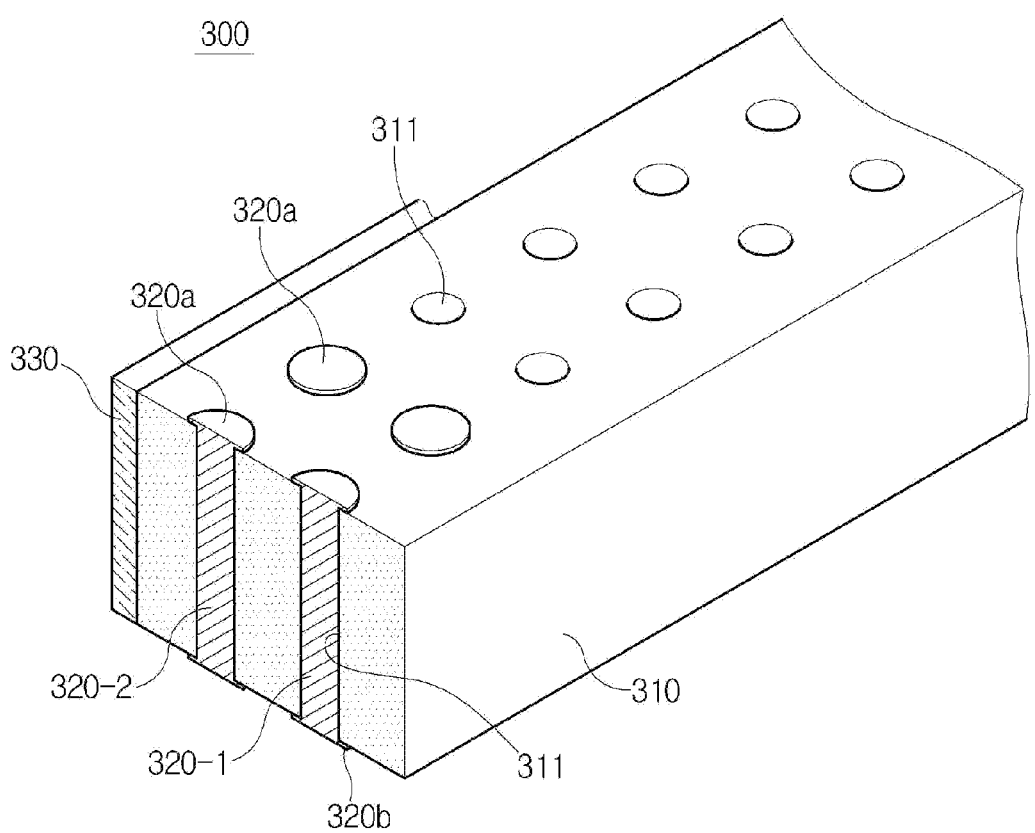

[FIG. 6]
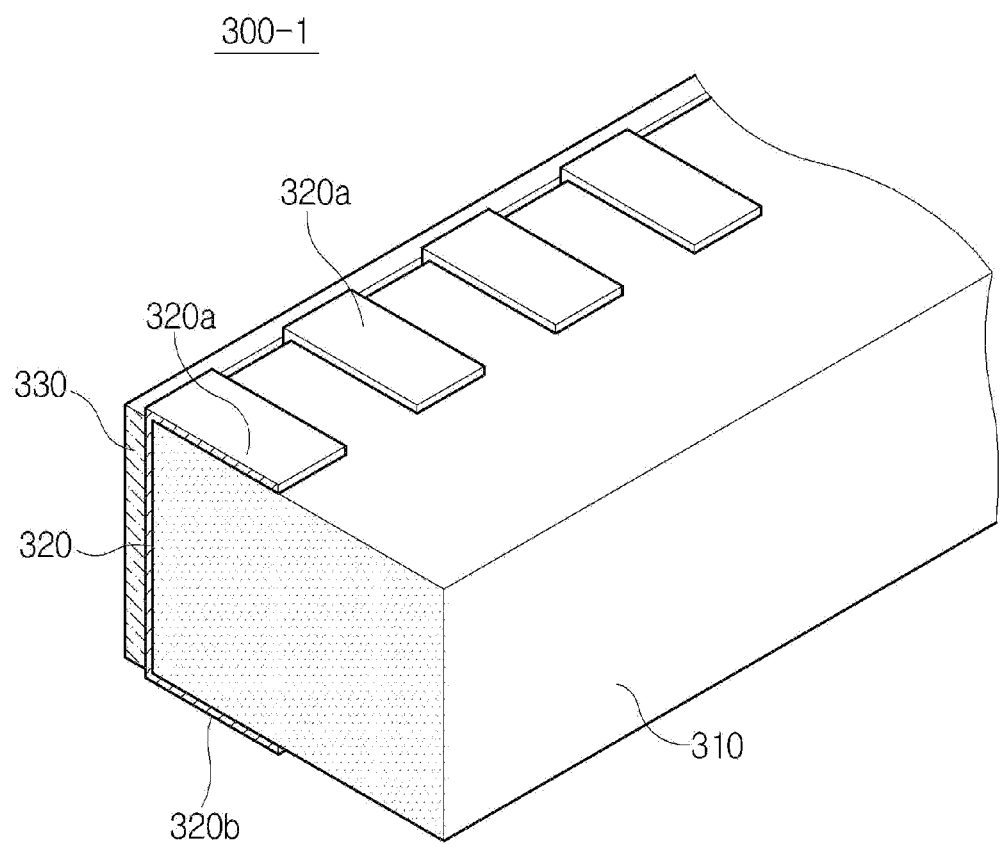

[FIG. 7]
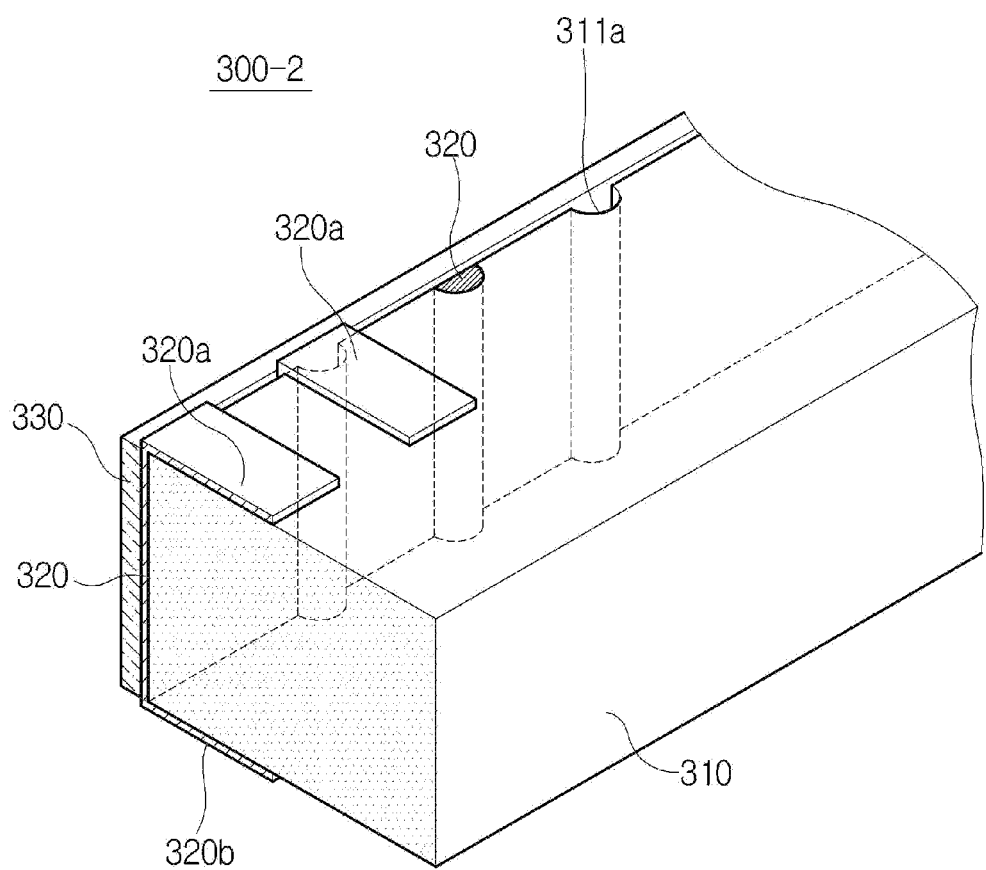

[FIG. 8]
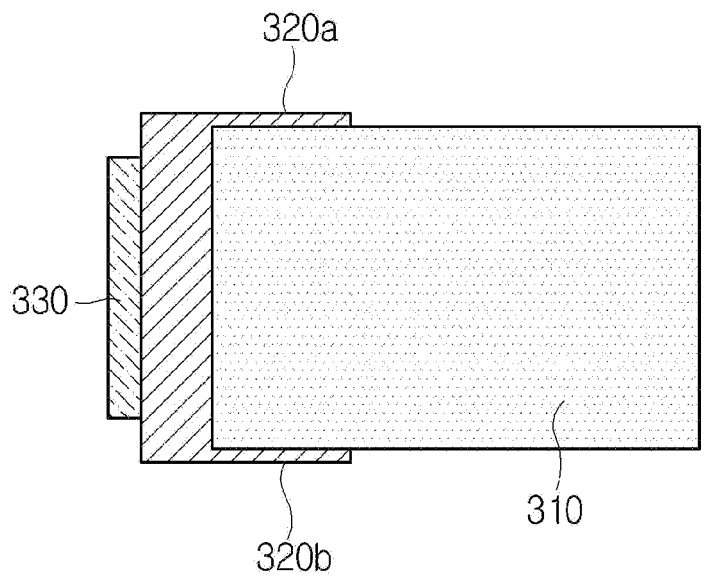
[FIG. 9]
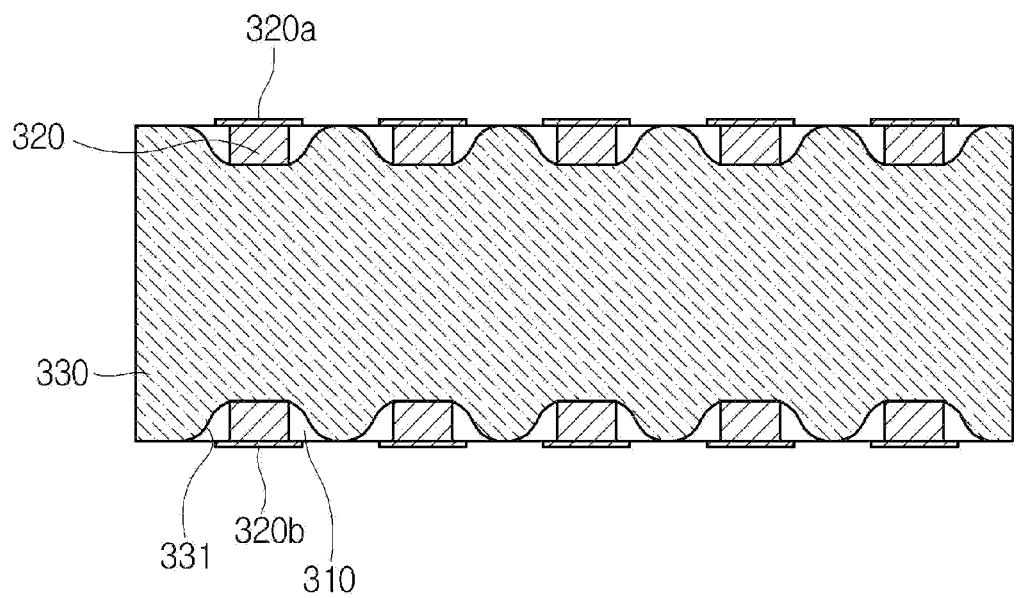

[FIG. 10]
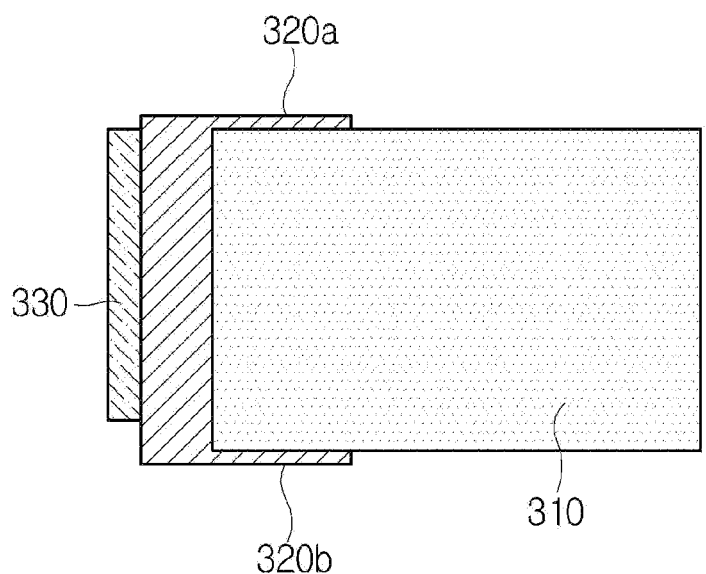
[FIG. 11]
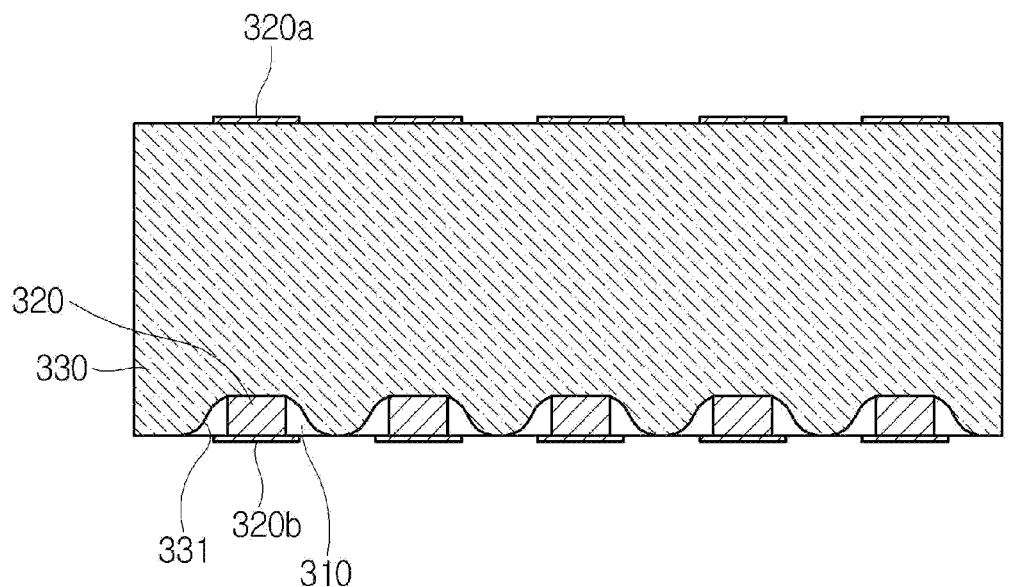

[FIG. 12]
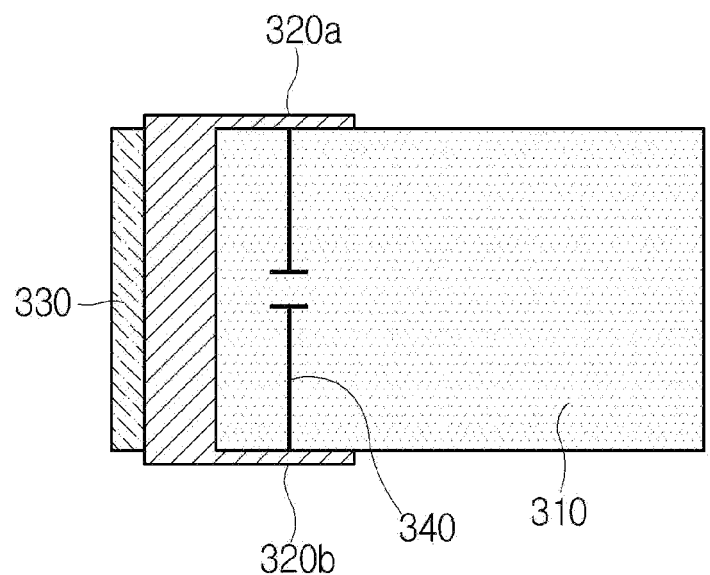

[FIG. 13]
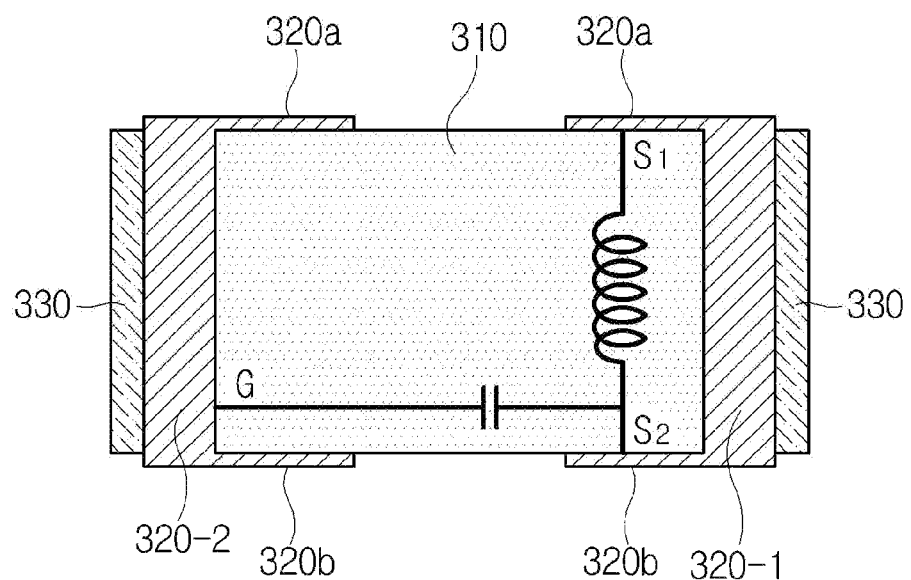

[FIG. 14]
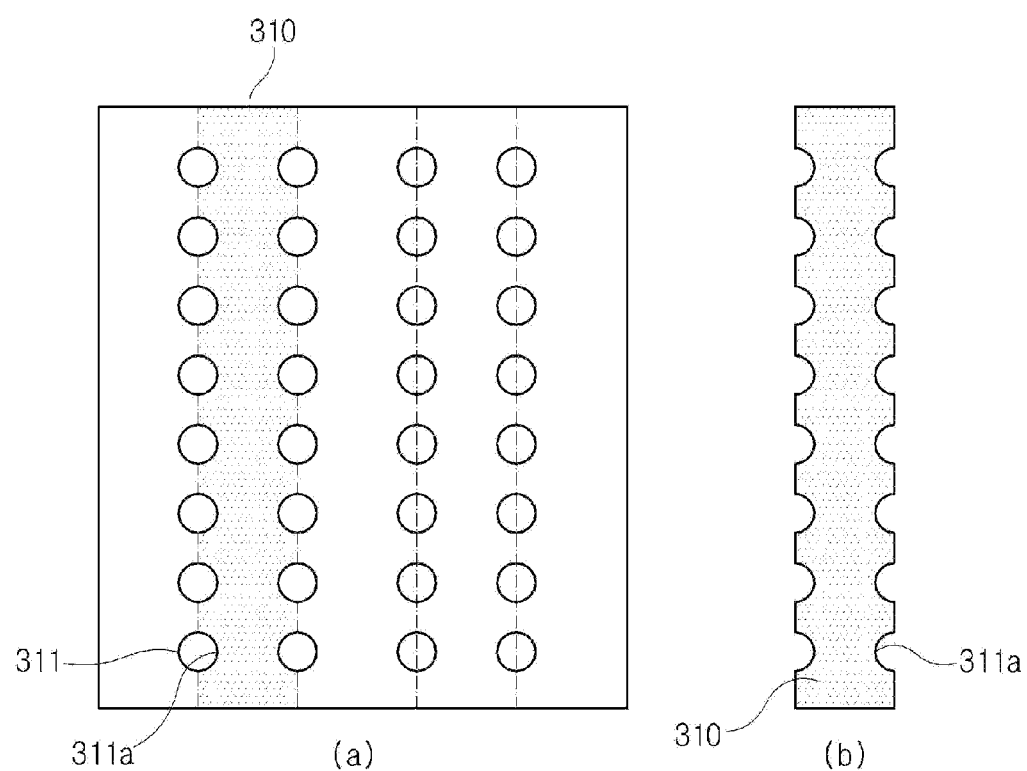

[FIG. 15]
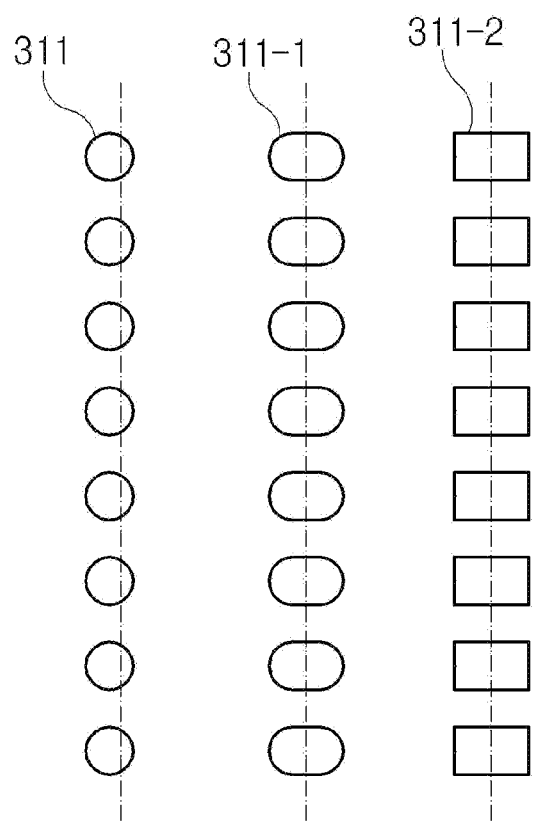

INTERPOSER

TECHNICAL FIELD

The present disclosure relates to an interposer, and more specifically, to an interposer which is disposed between a substrate and a substrate, and connects electrical signals.

BACKGROUND ART

In general, an interposer refers to a substrate which is additionally inserted between an integrated circuit and a circuit board, when the size of an I/O pad of the integrated circuit is not equal to the size of an I/O pad of the circuit board.

The interposer includes a through-structure via and a multi-layered wiring structure to redistribute an I/O of an integrated circuit IC.

Recently, the improvement in performances of cameras, displays, smart phones and the like has increased data throughput. Thus, in order to lengthen the lifetime of a battery, the area of a substrate is reduced while the area of the battery is increased.

In order to reduce the area of a substrate, the width of the substrate may be reduced, and the number of layers may be increased. Furthermore, the thickness of the substrate may be reduced through a fine pattern, which makes it possible to fabricate the substrate with a high degree of integration. Furthermore, a substrate and a substrate may be connected through an interposer, in order to additionally secure a battery mounting space. The interposer has a lower signal loss rate and smaller power consumption than a cable.

Furthermore, with the increase in data throughput and integration degree of an electronic device, the need for an interposer to connect substrates or connect a substrate and a chip is increasing. Furthermore, the interposer technology plays an important role to implement high performance and size reduction of an electronic device.

SUMMARY OF INVENTION

Technical Problem

The present disclosure is proposed to solve the above conventional problem, and an object of the present disclosure is to provide an interposer which has excellent dimensional stability to contribute to implementing high performance of an electrode device and reducing the size of the electronic device, makes it possible to implement a fine pattern, and has excellent reliability of signal transmission.

Solution to Problem

To achieve the object, an interposer according to an exemplary embodiment of the present disclosure includes: a support body including a top surface and a bottom surface, at least a part of the support body disposed along the edge of a substrate, a connection electrode configured to connect the top surface and bottom surface of the support body and a shielding member disposed at an outer surface of the support body.

The support body may be disposed along the edge of the substrate, as one part or a combination of two or more parts, selected from a group including a straight part is disposed in a straight line shape along a part of the edge of the substrate, a inclined part is disposed in an inclined shape so as to be adjacent to a part of the edge of the substrate or a corner of the substrate and a curved part is disposed in a round shape.

The support body may be formed of a ceramic material.

The connection electrode may be formed as a conductive material filled in a via hole formed through the support body in a thickness direction thereof to connect the top and bottom surfaces of the support body.

The via holes may be formed in two or more rows in the support body in a longitudinal direction thereof, and the connection electrode filling the via holes may include a signal line and a ground line disposed outside the signal line.

The shielding member may be formed of a conductive shielding material.

The connection electrode may be formed as a conductive material applied to the outer surface of the support body so as to connect the top and bottom surfaces of the support body.

The connection electrode may be formed as a conductive material filled in a via groove, the via groove formed in a recess shape at the outer surface of the support body, to connect the top surface and bottom surface of the support body.

The via groove may be formed by dividing a via hole formed through the support body in the thickness direction thereof or cutting the support body so as to open one side of the via hole.

The connection electrode may be formed through a process of forming a via hole through the support body in a thickness direction thereof, filling the via hole with a conductive material, and cutting the support body at the via hole.

The shielding member may be disposed at the outer surface of the support body so as to cover the connection electrode.

The shielding member may have a concave portion formed at the outer surface of the support body and configured to expose at least a part of an upper portion of the connection electrode, abutting on the top surface of the support body, and a lower portion of the connection electrode, abutting on the bottom surface of the support body.

The support body may be formed of a single-layered or multi-layered ceramic material.

The support body may include a decoupling capacitor or a bypass capacitor.

The support body may include a common mode filter.

The support body may include reinforcement parts for preventing deformation.

The reinforcement parts may be integrated with the support body, and disposed in a lattice shape in an internal empty space of the support body so as to cross each other in a straight line shape or curved line shape.

The reinforcement parts may be integrated with the support body, and irregularly formed in a curved shape in an internal empty space of the support so as to avoid parts mounted on the substrate.

Advantageous Effects

According to the present disclosure, the interposer may be formed of a ceramic material to reduce the via size or the signal line width and interval, which makes it possible to implement a multi-layered structure. Thus, a fine pattern (micro circuit) can be implemented, and the manufacturing cost can be reduced. Furthermore, although the interposer is formed of a ceramic material, bending deformation and contraction can be prevented through a constrained sintering process using a constraint layer or dummy for constraint.

Therefore, it is possible to improve the dimensional stability and the reliability of signal transmission.

Furthermore, the connection electrode may be formed on the outer surface of the support body so as to make up for the strength of the support body, and the shielding member may be disposed to stably fix the substrates such that the upper and lower portions of the connection electrode are exposed during electrode soldering. Thus, the reliability of signal transmission may be further raised to significantly contribute to implementing high performance of an electronic device and reducing the size of the electronic device.

BRIEF DESCRIPTION OF DRAWINGS

FIG. 1 is a perspective view illustrating an interposer in accordance with an embodiment of the present disclosure.

FIGS. 2A to 2C are plan views illustrating various examples of a support body in the interposer in accordance with the embodiment of the present disclosure.

FIG. 3A is a diagram for describing an example in which deformation may occur during a sintering process in the interposer in accordance with the embodiment of the present disclosure.

FIGS. 3B to 3D are plan views illustrating various examples in which reinforcement parts are formed in the support body in the interposer in accordance with the embodiment of the present disclosure.

FIG. 4 is a cross-sectional view illustrating that a substrate and a substrate are connected by the interposer in accordance with the embodiment of the present disclosure.

FIG. 5 is a cut perspective view for describing the interposer of FIG. 4.

FIG. 6 is a cut perspective view illustrating an interposer in accordance with another embodiment of the present disclosure.

FIG. 7 is a cut perspective view illustrating an interposer in accordance with still another embodiment of the present disclosure.

FIG. 8 is a cross-sectional view illustrating an example in which a shielding member is attached to the interposer of FIG. 6.

FIG. 9 is a diagram illustrating the outer surface of the interposer of FIG. 8.

FIG. 10 is a cross-sectional view illustrating another example in which a shielding member is attached to the interposer of FIG. 6.

FIG. 11 is a diagram illustrating the outer surface of the interposer of FIG. 10.

FIG. 12 is a cross-sectional view illustrating an example in which a decoupling capacitor is disposed in the interposer of FIG. 6.

FIG. 13 is a cross-sectional view illustrating an example in which a common mode filter is disposed in the interposer of FIG. 6.

FIG. 14 is a diagram illustrating a method for forming a via groove in the interposer of FIG. 7.

FIG. 15 is a diagram illustrating various examples of the shape of the via groove in the interposer in accordance with the embodiment of the present disclosure.

DESCRIPTION OF EMBODIMENTS

Hereafter, embodiments of the present disclosure will be described in detail with reference to the accompanying drawings.

As illustrated in FIG. 1, at least a part of an interposer 300 in accordance with an embodiment of the present disclosure is disposed along the edge of a substrate 100 so as to connect the substrate 100 and a substrate 200.

In an embodiment, at least a part of the interposer 300 is disposed along the edge of the lower substrate 100, and connects the lower substrate 100 and the upper substrate 200. For convenience of description, the lower substrate 100 and the upper substrate 200 will be each referred to as a substrate.

The interposer 300 includes a support body 310 and a connection electrode 320 to connect the top and bottom surfaces of the support body 310. The support body 310 is formed of a dielectric material. Desirably, the support body 310 is formed of a ceramic material.

When the support body 310 is formed of a ceramic material, the connection electrode 320 may be formed to have a small width, which makes it easy to implement a micro circuit. Furthermore, as the support body 310 is formed as a multi-layered structure, the volume of the interposer 300 may be reduced while the connection electrode 320 is included in the support body 310. When the volume of the interposer 300 is reduced, the interposer 300 may be easily disposed along the edges of the substrates 100 and 200, which makes it more easier to improve the performance of an electronic device and to reduce the size of the electronic device.

When the support body 310 is formed of a ceramic material, the connection electrode may be implemented to have a width of up to 75 μm, the distance between the connection electrodes may be set to a value of up to 50 μm, and a via hole may be implemented to have a diameter of at least 70 μm. When the width of the electrode and the diameter of the via hole are reduced, a micro circuit may be more easily implemented to reduce the thickness of the interposer. This structure may reduce the distance between the lower substrate 100 and the upper substrate 200, thereby raising the reliability of signal transmission. Furthermore, when the support body 310 is formed of a ceramic material, the fabrication cost can be reduced, which makes it possible to implement the interposer at a low price.

When the support body 310 is formed of an epoxy (FR4) material which is an FPCB material, the connection electrode may be implemented to have a width of up to 90 μm, the distance between the connection electrodes may be set to a value of up to 65 μm, and the via hole may be implemented to have a diameter of at least 200 μm. However, when the support body 310 is formed of an FR4 material, the support body may have only one layer or two layers stacked therein due to the thickness of the FR4 material, which makes it difficult to reduce the volume of the interposer and to implement a fine pattern.

When the support body is formed of a silicon material, the connection electrode may be implemented to have a width of up to 5 μm, the distance between the connection electrodes may be set to a value of up to 5 μm, and the via hole may be implemented to have a diameter of less than 75 μm. However, a silicon interposer is vulnerable to mechanical stress, and the fabrication cost thereof is very high.

As illustrated in FIGS. 2A to 2C, the support body 310 may be implemented as one part or a combination of two or more parts selected from a straight part 310a, an inclined part 310b and a curved part 310c. The straight part 310a may be disposed in a straight line shape along the edge of the substrate, the inclined part 310b may be disposed in an inclined shape along the edge of the substrate, and the curved part 310c may be disposed in a round shape along the edge of the substrate. Furthermore, the support body 310 may be disposed along the edge of the substrate, and formed in a closed loop shape.

For example, as illustrated in FIG. 2A, the support body 310 may be disposed in a rectangular shape on the substrate, the rectangular shape being formed by connecting four straight parts 310*a*.

Alternatively, as illustrated in FIG. 2B, the support body 310 may be formed in substantially a rectangular shape obtained by combining the straight parts 310*a* and the inclined parts 310*b* which are each disposed in an inclined shape so as to be adjacent to a part of the edge or a corner of the substrate.

Alternatively, as illustrated in FIG. 2C, the support body 310 may be disposed in a shape obtained by combining the straight parts 310*a*, the inclined parts 310*b* and the curved part 310*c*. The curved part 310*c* may serve as a part to avoid a portion to which a screw is fastened.

Examples of an electronic device in which the support body 310 is disposed along the edge of a substrate may include a TV, a navigation system, a camera, and a mobile device such as a mobile phone.

As illustrated in FIG. 3A, the support body 310 is formed in a frame shape with an empty space therein, because the support body 310 is disposed along the edge of the substrate. The support body 310 may be deformed by heat generated from parts mounted on the lower and upper substrates 100 and 200 after a sintering process or due to a change in temperature of the surrounding environment. For example, the support body 310 may be bent outward as indicated by a dotted line of FIG. 3A. When the support body 310 is bent due to such an influence, the support body 310 may be disconnected from the lower substrate 100 or the upper substrate 200 due to the deformation thereof.

Therefore, as illustrated in FIG. 3B, the support body 310 may include reinforcement parts 315 for preventing the deformation thereof. The reinforcement parts 315 may be disposed in the internal empty space of the frame-shaped support body 310 so as to cross each other with a predetermined distance provided therebetween. The reinforcement parts 315 and the support body 310 may be formed of the same material, and integrated with each other.

The reinforcement part 315 functions to prevent the bending deformation of the support body 310. Furthermore, the reinforcement part 315 may prevent the lower and upper substrates 100 and 200 from being attached to each other depending on the contraction and expansion ratio therebetween.

The reinforcement part 315 may be connected to the support body 310, and formed in a lattice shape or irregular shape. The lattice distance between the reinforcement parts 315 may be designed so that the reinforcement parts 315 do not interfere with parts mounted on the lower and upper substrates 100 and 200.

When the reinforcement parts 315 are included in the support body 310, it is possible to prevent the deformation of the support body 310. The support body 310 may be used with the reinforcement parts 315 included therein, in order to prevent the deformation thereof.

Specifically, the reinforcement parts 315 may be formed in a lattice shape in the internal empty space of the frame-shaped support body 310 such that straight reinforcement parts or curved reinforcement parts cross each other with a predetermined distance provided therebetween.

For example, as illustrated in FIG. 3B, the reinforcement parts 315 may be regularly formed with a large lattice distance provided therebetween, in order to not only prevent the deformation of the support body 310, but also prevent the interference with the parts mounted on the substrates.

Alternatively, as illustrated in FIG. 3C, the reinforcement parts 315 may regularly formed with a small lattice distance provided therebetween within such a range that the reinforcement parts 315 do not interfere with the parts mounted on the substrates.

Alternatively, as illustrated in FIG. 3D, reinforcement parts 315*a* may be formed in a curved or irregular shape so as to avoid the parts mounted on the substrates.

FIGS. 3A to 3D illustrate that the reinforcement parts 315 include no connection electrodes, because the reinforcement parts 315 function to prevent the bending deformation of the support body 310 after a sintering process. If necessary, however, the reinforcement parts 315 may include the connection electrodes.

The connection electrode 320 connects the top and bottom surfaces of the support body 310. The plurality of connection electrodes 320 are disposed in the longitudinal direction of the support body 310.

As illustrated in FIG. 4, the interposer 300 connects the lower substrate 100 and the upper substrate 200. The interposer 300 connects the lower and upper substrates 100 and 200 to the connection electrode 320 through solder balls 400. The solder ball 400 is an adhesive for connecting electrodes, and contains lead as the main component thereof.

At this time, a main chip, a surface-mount device part and the like, which are mounted on the lower substrate 100, may be connected to a TPV (Through-Package Via) 210 of the upper substrate 200 through a circuit line printed on the lower substrate 100 and the connection electrode 320 of the interposer 300, and connected to an auxiliary chip or the like through a circuit line printed on the upper substrate 200. The lower substrate 100 may have the main chip, the surface-mount device parts and the like, which are mounted thereon, and the upper substrate 200 may have the auxiliary chip and the like, which are mounted thereon.

The support body 310 has a shielding member 330 disposed on an outer surface thereof. The shielding member 330 serves to shield electromagnetic waves. The shielding member 330 may be formed of a conductive shielding material. The shielding member 330 may be formed on the outer surface of the support body 310 through a plating process, a zinc spraying process or a coating or printing process using conductive paint.

As illustrated in FIG. 5, the connection electrode 320 is formed through a process of forming a via hole 311 through the support body 310 in the thickness direction thereof, and filling the via hole 311 with a conductive material to connect the top and bottom surfaces of the support body 310. The via holes 311 may be formed in one or more rows in the longitudinal direction of the support body 310.

In an embodiment, the via holes 311 are formed in two rows in the longitudinal direction of the support body 310. The connection electrode 320 filling the via hole 311 includes a signal line 320-1 and a ground line 320-2 disposed outside the signal line 320-1. When the ground line 320-2 is disposed outside the signal line 320-1, the ground line 320-2 grounds electromagnetic waves to exhibit an electromagnetic wave shielding effect.

The via holes 311 may be formed in three or four rows in the longitudinal direction of the support body 310. When the via holes 311 are formed in three or four rows, one connection electrode to fill the outermost via hole may be configured as a ground line, and connection electrodes to fill the other two or three via holes inside the outermost via hole may be configured as signal lines. Alternatively, one connection electrode to fill the outermost via hole may be configured as a ground line, another connection electrode to fill a via hole inside the outermost via hole may be configured as a power supply line, and the other connection electrode may be configured as a signal line.

In the connection electrode 320 filling the via hole 311, a portion exposed to the top surface of the support body 310 becomes a top electrode 320a, and a portion exposed to the bottom surface of the support body 310 becomes a bottom electrode 320b. The top electrode 320a and the bottom electrode 320b may be formed to have a larger area than the via hole 311. For ease of identification, the sizes of the top and bottom electrodes 320a and 320b are exaggerated in the drawings.

The support body 310 may be formed of a ceramic material with a single-layered or multi-layered structure. The support body 310 may be fabricated with a multi-layered structure when an internal electrode is included therein, and fabricated with a single-layered structure when no internal electrode is included therein.

When the support body 310 has a multi-layered structure, an internal electrode may be disposed in the support body 310, which makes it possible to reduce the size of the interposer 300 and to implement a high degree of integration, and makes it easy to simplify the fabrication process and to reduce the fabrication cost.

When the support body 310 has a multi-layered structure, the support body 310 may be formed through a process of forming a ceramic green sheet, boring a via hole by cutting the ceramic green sheet, filling the via hole with a conductor, printing a wiring line to form an internal electrode, stacking the ceramic green sheets each having the wiring line printed thereon, and cutting and sintering the stacked ceramic green sheets.

Alternatively, when the support body 310 has a multi-layered structure, the support body 310 may be formed through a process of forming a ceramic green sheet, printing a wiring line to form an internal electrode, stacking the ceramic green sheets each having the wiring line printed thereon, cutting the stacked ceramic green sheets, forming via holes by blanking the stacked ceramic green sheets in a mold, and sintering the stacked ceramic green sheets.

Alternatively, when the support body 310 has a multi-layered structure, the support body 310 may be formed through a process of forming a ceramic green sheet, forming via holes in the single-layered ceramic green sheet or the stacked ceramic green sheets while cutting the ceramic green sheet or the stacked ceramic green sheets in a mold, and sintering the ceramic green sheet or the stacked ceramic green sheets having the via holes formed therein.

The ceramic material forming the support body 310 may include one or more materials selected from LTCC (Low Temperature Co-fired Ceramic), HTCC (High Temperature Co-fired Ceramic) and dielectric ceramic powder. LTCC may include glass and ceramic additives. HTCC may include alumina (Al2O3) powder and other additives.

Ceramic is contractionally deformed by 10 to 20% during a sintering process. In order to prevent contractional deformation and bending deformation of ceramic even though the ceramic support body is manufactured with various types of structures, constrained sintering is applied thereto during the sintering process.

During the constrained sintering, a ceramic stacked body including a constraint layer which is not sintered at the sintering temperature of the ceramic stacked body is sintered to prevent the deformation of the ceramic stacked body.

Specifically, during the constrained sintering, a green sheet for constraint is disposed on the top and bottom surfaces of the green sheet or green sheet stacked body, and sintered at the sintering temperature of the green sheet. The sintering temperature may be set in the range of 800 to 900° C., which corresponds to the sintering temperature of the green sheet (LTCC). While the sintering is performed, the green sheet for constraint prevents the green sheets, which constitute the green sheet stacked body, from contracting in a plane direction.

The green sheet for constraint is formed of a material which is neither inserted at the sintering temperature of the green sheet, nor oxidized even though it is thermally treated in the air. For example, the green sheet for constraint may be formed by stacking alumina sheets. Alternatively, the green sheet for constraint may be a ceramic green sheet having no via holes formed therein.

After the sintering process, the green sheet for constraint is removed. The green sheet stacked body may be cut in units of stacked body panels after the constrained sintering, and subjected to the constrained sintering after being cut in units of stacked body panels.

Alternatively, dummy layers may be disposed on the top and bottom surfaces of the green sheet stacked body, respectively, the green sheet for constraint may be disposed on each of the dummy layers, and the green sheet stacked body may be then sintered at the sintering temperature of the green sheet. This structure may prevent a reduction in adhesion between particles at the interface between the alumina green sheet for constraint and the green sheet stacked body, thereby preventing an occurrence of void at the interface. Furthermore, the structure may raise a constraining force to control a contraction deviation and flatness of the support body in the plane direction after the sintering process. At this time, a green sheet may be disposed as the dummy layer. In this case, the dummy layer and the green sheet for constraint are removed after the sintering process. The dummy layer and the green sheet for constraint may be removed through lapping. The constrained sintering prevents the bending deformation of the support body 310 formed of a ceramic material during the sintering process, thereby increasing the dimensional stability of the interposer 300.

As illustrated in FIGS. 2A to 2C, the support body 310 is disposed as one part or a combination of two or more parts selected from the straight part 310a, the inclined part 310b and the curved part 310c along the edge of the substrate, and formed in a closed circuit shape.

Therefore, the support body 310 has a frame shape with an empty space therein, while the support body 310 is a green sheet stacked body before the sintering process. When the green sheet stacked body having a frame shape with an empty space formed therein is sintered, the green sheet stacked body may be distorted. Thus, before the green sheet stacked body is sintered, a dummy for constraint is disposed to fill the internal empty space of the frame-shaped green sheet stacked body. Then, the sintering process is performed.

The dummy for constraint may be an alumina dummy to fill the internal empty space of the green sheet stacked body. After the sintering process, the dummy for constraint is removed. In order to easily remove the dummy for constraint, the contact surface between the green sheet stacked body and the dummy for constraint may be coated with a release agent. As the release agent, a lubricant may be used.

Furthermore, the dummy for constraint may be a green sheet stacked body. When the green sheet stacked body is blanked in a frame shape, a portion thereof, which is to be the internal empty space, is half cut, and the green sheet stacked body is sintered. Since the boundary between the dummy for constraint and the green sheet stacked body is half cut, a slight impact may be applied to remove the dummy for constraint from the green sheet stacked body.

As such, the distortion of the support body 310, which may occur when the frame-shaped ceramic green sheet stacked body having the internal empty space therein is inserted, may be prevented by the dummy for constraint which is disposed in the internal empty space of the green sheet or the green sheet stacked body in the form of the support body 310. Furthermore, the problem that the arrangement of the via holes may be distorted by surface contraction or bending may be prevented by the dummy layer for constraint disposed on each of the top and bottom surfaces of the green sheet or the green sheet stacked body.

In an embodiment, it has been described that the via holes 311 are formed through the green sheet stacked body. However, the via holes 311 may be formed through the green sheet stacked body after the green sheet stacked body is sintered.

The connection electrode 320 may be formed by sintering the support body 310 after the via hole 311 is filled with a conductive material, or formed by filling the via hole 311 with a conductive material after the support body 310 is sintered.

The conductive material forming the connection electrode 320 may include one or more elements selected from silver (Ag), copper (Cu), tungsten (W), molybdenum (Mo) and nickel (Ni). Besides, when the conductive material forming the connection electrode 320 is an electrical conductive material, the conductive material may be selected from various metals or alloys. The connection electrode 320 may be electrically connected to an internal electrode formed in the support body 310.

As illustrated in FIGS. 3B and 3C, the support body 310 may be disposed as one part or combination of two or more parts selected from the straight part 310a, the inclined part 310b and the curved part 310c along the edge of the substrate, and formed in a close loop shape. The one part or the combination of two or more part selected from the straight part 310a, the inclined part 310b and the curved part 310c may be connected in a lattice shape through the reinforcement parts 315.

As illustrated in FIG. 3D, the reinforcement parts 315a may be irregularly formed in a curved shape so as to avoid the parts mounted on the substrate.

The reinforcement parts 315 and the support body 310 may be formed of the same material. The reinforcement parts 315 are formed as the green sheet stacked body like the support body 310.

The support body 310 including the reinforcement parts 315 may be prevented from being bent, and solve the problem that the lower and upper substrates 100 and 200 are attached to each other due to the contraction and expansion ratio therebetween.

In another embodiment, as illustrated in FIG. 6, an interposer 300-1 may have a structure in which connection electrodes 320 are disposed on the outer surface of a support body 310 and connect the top and bottom surfaces of the support body 310. In the connection electrode 320, a portion connected to the top surface of the support body 310 becomes a top electrode 320a, and a portion connected to the bottom surface of the support body 310 becomes a bottom electrode 320b. The lengths and shapes of the top and bottom electrodes 320a and 320b may be designed in various manners so as to correspond to the positions of electrodes on the substrate connected to the interposer 300-1.

When the connection electrode 320 is disposed on the outer surface of the support body 310, no via holes may be formed in the support body 310. When the via holes are formed in the support body 310, there is a limitation in boring the via holes, and the via holes may reduce the strength of the support body 310. Therefore, the connection electrode 320 may be disposed on the outer surface of the support body 310, thereby making up for the disadvantage that the strength of the support body 310 is reduced by the via holes.

The plurality of connection electrodes 320 may be formed at predetermined intervals in the longitudinal direction of the support body 310.

The support body 310 has a shielding member 330 disposed at the outer surface thereof, the shielding member 330 serving to shield electromagnetic waves. The shielding member 330 is disposed at (the outer surface of the support body 310 so as to cover the connection electrodes 320 except the upper and lower portions of the connection electrodes 320.

The shielding member 330 may be formed of a non-conductive shielding material. In the case of FIG. 6, the shielding member 330 abuts on the connection electrode. Thus, in order to prevent a short circuit, the shielding member 330 may be formed of a non-conductive shielding material. For example, ferrite may be applied as the non-conductive shielding material. In this case, ferrite may be applied to the outer surface of the support body 310 having the connection electrodes formed thereon, or sprayed onto the outer surface of the support body 310.

In still another embodiment, as illustrated in FIG. 7, an interposer 300-2 may include a connection electrode 320 which is formed by filling a via groove 311a with a conductive material, the via groove 311a being formed in a recess shape at the outer surface of a support body 310. The connection electrode 320 connects to the top and bottom surfaces of the support body 310.

The via groove 311a may be formed through a process of forming a via hole 311 through the support body 310 in the thickness direction thereof and dividing the via hole 311 or cutting the support body 310 so as to open one side of the via hole 311.

Alternatively, the via groove 311a may be formed through a process of forming the via hole 311 through the support body 310 in the thickness direction thereof, filling the via hole 311 with a conductive material, and cutting the support body 310 at the via hole 311. The process of cutting the support body 310 may be performed by blanking the support body 310 in a frame shape in a mold.

The support body 310 has a shielding member 330 disposed at the outer surface thereof, the shielding member 330 serving to shield electromagnetic waves. The shielding member is disposed at the outer surface of the support body so as to cover the connection electrode 320. The shielding member 330 may be formed of a non-conductive shielding material.

When the connection electrode 320 is disposed on the outer surface of the support body 310 as illustrated in FIG. 6, no via holes may be formed in the support body 310. However, due to the thickness of the connection electrode 320 formed on the outer surface of the support body 310, the shielding member 330 may be difficult to uniformly apply, and the support body 310 coated with the shielding member 330 may have an uneven outer surface.

Therefore, as illustrated in FIG. 7, when the via groove 311a is formed in a recess shape at the outer surface of the support body 310 and the connection electrode 320 is formed by filling the via groove 311a with a conductive material, the connection electrode 220 may not protrude from the outer surface of the support body 310, but form the same plane as the outer surface of the support body 310, even though the connection electrode 320 is disposed on the outer surface of the support body 310. This structure makes it possible to uniformly coat the support body 310 with the shielding member 330, such that the support body 310 coated with the shielding member 330 also has an even outer surface.

In the connection electrode 320, a portion connected to the top surface of the support body 310 becomes a top electrode 320a, and a portion connected to the bottom surface of the support body 310 becomes a bottom electrode 320b. The lengths and shapes of the top and bottom electrodes 320a and 320b may be designed in various manners so as to correspond to the positions of electrodes on the substrate connected to the interposer 300-2.

In yet another embodiment, as illustrated in FIGS. 8 and 9, an interposer 300-3 may have a structure in which a connection electrode 320 is disposed on the outer surface of a support body 310 and connects the top and bottom surfaces of the support body 310. In the connection electrode 320, a portion connected to the top surface of the support body 310 becomes a top electrode 320a, and a portion connected to the bottom surface of the support body 310 becomes a bottom electrode 320b.

The support body 310 has a shielding member 330 disposed on the outer surface thereof, the shielding member 330 serving to shield electromagnetic waves.

The shielding member 330 may have a concave portion 331 formed at the outer surface of the support body 310 so as to expose at least a part of the upper portion of the connection electrode 320, abutting on the top surface of the support body 310, and the lower portion of the connection electrode 320, abutting on the bottom surface of the support body 310.

The concave portion 331 serves to raise the adhesion strength between the substrate and solder balls of the top and bottom electrodes. When the upper and lower portions of the connection electrode 320 are exposed, the soldering area may be easily secured, and the adhesion strength between the substrate and the connection electrode 320 may be raised.

The adhesion strength between the substrate and the connection electrode 320 needs to be set to a high value, in order to stably fix the interposer 300-3 to the substrate. Specifically, the contact area between the solder ball 400 and the connection electrode 302 or a conduction electrode of the substrate needs to be set to a sufficient large area.

The concave portion 331 may be formed in a round shape to expose only the lower and upper portions of the connection electrode 320, thereby not only maximizing the electromotive wave shielding effect through the shielding member 330, but also raising the adhesion strength of the solder ball (400 of FIG. 4).

In an embodiment, the concave portion 331 may be formed at both the upper portion of the connection electrode 320, abutting on the top surface of the support body 310, and the lower portion of the connection electrode 320, abutting on the bottom surface of the support body 310, and expose the upper and lower portions of the connection electrode 320.

In still yet another embodiment, as illustrated in FIGS. 10 and 11, an interposer 300-4 may have a structure in which a connection electrode 320 is disposed on the outer surface of a support body 310 and connects the top and bottom surfaces of the support body 310. In the connection electrode 320, a portion connected to the top surface of the support body 310 becomes a top electrode 320a, and a portion connected to the bottom surface of the support body 310 becomes a bottom electrode 320b.

The support body 310 has a shielding member 330 disposed at the outer surface thereof, the shielding member 330 serving to shield electromagnetic waves.

A concave portion 331 may be formed at the lower portion of the connection electrode 320, abutting on the bottom surface of the support body 310, and expose the lower portion of the connection electrode 320.

Alternatively, although not illustrated, the concave portion 331 may be formed at the upper portion of the connection electrode 320, abutting on the top surface of the support body 310, and expose the upper portion of the connection electrode 320.

Alternatively, although not illustrated, the concave portions 331 may be alternately and regularly or irregularly formed at the upper portion of the connection electrode 320, abutting on the top surface of the support body 310, and the lower portion of the connection electrode 320, abutting on the bottom surface of the support body 310, and alternately expose the upper and lower portions of the connection electrode 320. In this case, it is possible to maximize the electromagnetic wave shielding effect while raising the adhesion strength of the solder ball.

In a further embodiment, as illustrated in FIG. 12, an interposer 300-5 may include a connection electrode 320 which is formed by filling a via groove 311a with a conductive material, the via groove 311a being formed in a recess shape at the outer surface of a support body 310. The connection electrode 320 connects to the top and bottom surfaces of the support body 310.

The support body 310 has a shielding member 330 disposed at the outer surface thereof, the shielding member 330 serving to shield electromagnetic waves. The shielding member 330 may be disposed at the outer surface of the support body 310 so as to cover the connection electrode 320. The shielding member 330 may be formed of a non-conductive shielding material.

A decoupling capacitor 340 may be disposed in the support body 310. The decoupling capacitor 340 may be disposed in the support body 310 such that one side thereof is connected to a top electrode and the other side is connected to a bottom electrode. The decoupling capacitor 340 may be formed in the support body 310 during an internal electrode formation process.

The decoupling capacitor 340 serves to protect a circuit by decoupling the circuit from high-frequency noise loaded in a power supply line or signal line. The decoupling capacitor 340 may be disposed between the signal line and a ground line when two connection electrodes are provided.

Alternatively, although not illustrated, a bypass capacitor may be disposed in the support body 310. The bypass capacitor serves to protect a circuit by bypassing high-frequency noise, loaded in the power supply line or signal line, to the ground.

In another further embodiment, as illustrated in FIG. 13, an interposer 300-6 may include a connection electrode 320 which is formed by filling a via groove (see 311a of FIG. 7) with a conductive material, the via groove being formed in a recess shape at either side surface of a support body 310.

The connection electrode 320 connects to the top and bottom surfaces of the support body 310.

The connection electrode 320 may include a signal line 320-1 and a ground line 320-2.

The support body 310 has a shielding member 330 disposed at the outer surface thereof, the shielding member 330 serving to shield electromagnetic waves. The shielding member 330 may be formed of a non-conductive shielding material.

The support body 310 may include a common mode filter 350 disposed therein. The common mode filter 350 may be a stacked common mode filter configured by stacking internal electrodes in the support body 310 with a multi-layered structure. The common mode filter 350 is a noise removing filter using the electromagnetic characteristic of a magnetic material, and serves to selectively transmit only a desired signal.

As illustrated in FIG. 14, a via groove 311a may be formed through a process of forming a via hole 311 through the support body 310 in the thickness direction thereof and dividing the via hole 311 or cutting the support body 310 so as to open one side of the via hole 311.

In this case, the via groove 311a is formed in a recess shape at the outer surface of the support body 310.

Specifically, the via groove 311a may be formed at one side surface or either side surface of the support body 310, and filled with a conductive material to form the connection electrode 320 that connects the top and bottom surfaces of the support body 310.

When the via groove 311a is formed in a recess shape at the outer surface of the support body 310, the strength of the support body 310 may be secured more easily than in the case of FIG. 5, because the via groove 311a has a smaller area than the via groove of FIG. 5 and does not pass through the middle of the support body. Furthermore, since one via hole is divided so as to be used by two support bodies, the number of via holes punched in the support body 310 may be reduced.

As illustrated in FIG. 15, via holes 311, 311-1 and 311-2 formed by punching the support body may have various shapes such as a circle, a long-hole shape and a rectangle.

Furthermore, the circular via hole 311 may not be divided in half, but an off-center portion thereof may be cut to form a via groove. Furthermore, the support body may be cut so that the long hole-shaped via hole 311-1 is divided in half, in order to form a via groove. Furthermore, the support body may be cut so that the rectangular via hole 311-2 is divided in half, in order to form a via groove.

In the above-described interposer 300, the support body 310 may have a height of 5 mm or less. Alternatively, the size of the via hole formed in the support body 310 may range from 0.15 mm to 1.1 mm, and the via hole may be formed by vertically punching the support body 310 without a stacked structure. The support body 310 may be a stacked support body or a single-layered support body.

An internal electrode (internal circuit) formed in the support body 310 may be formed by stacking ceramic green sheets, in order to implement various internal stacked circuit patterns.

Furthermore, the shielding member 330 may formed by coupling and applying various metal frames such as SUS and nickel silver. When a conductive shielding member is applied, the shielding member 330 may be formed by applying a conductive material to various metal frames such as SUS and nickel silver or plating the various metal frames with a conductive material. The conductivity treatment may include coating a metal frame with a carbon-based material or coating a metal frame with paste such as silver, copper, tungsten or molybdenum, and the plating may include plating a metal frame with nickel, copper, tin, silver, gold or palladium.

The above-described interposer may be applied by mixing the embodiment, the another embodiment and the other embodiments.

Hereafter, the test result of the dimensional stability of the interposer in accordance with the present disclosure will be described.

In order to test the dimensional stability of the interposer in accordance with the present disclosure, three sample support bodies 310 were manufactured in a shape obtained by combining the straight parts 310a, the inclined parts 310b and the curved part 310c as illustrated in FIG. 2C, and the straightness, the perpendicularity, the distance and the like of each of the sample support bodies 310 were measured.

The test result showed that the three samples had even maximum straightness, even perpendicularity, and constant distance, which means that the samples have excellent dimensional stability.

Furthermore, in order to test the dimensional stability of the interposer in accordance with the present disclosure, two sample support bodies 310 each further including the reinforcement part 315 in a structure obtained by combining the straight parts 310a, the inclined parts 310b and the curved part 310c as illustrated in FIGS. 3B and 3C were manufactured through a sintering process without a dummy for inner constraint and a dummy for outer constraint, and the counter dimensions of the sample support bodies 310 and the dimensions of connection terminals were measured.

Dimensions obtained by measuring two samples of FIG. 3B and the two samples of FIG. 3C, which were manufactured through a sintering process without a dummy for inner constrain and a dummy for outer constrain, were compared to design values. The comparison result showed that the measured dimensions were included between the upper limit tolerance and the lower limit tolerance, which indicates that the inclusion of the lattice-shaped reinforcement parts connecting the edges of the support body can prevent the bending deformation in the support body.

As described above, the interposer in accordance with the present disclosure may be formed of a ceramic material, which makes it possible to implement a fine pattern (micro circuit) and to reduce the manufacturing cost. Furthermore, since bending and contraction of the support body are prevented through constrained sintering even though the interposer is formed of a ceramic material, the interposer has excellent dimensional stability. Thus, the reliability of signal transmission is excellent.

Furthermore, the connection electrode may be formed on the outer surface of the support body, thereby improving the strength of the support body. Furthermore, since the shielding member is disposed to expose the upper and lower portions of the connection electrode when the connection electrode is soldered, the substrates may be more stably fixed to each other, which makes it possible to raise the reliability of signal transmission.

Furthermore, one or more of the decoupling capacitor, the bypass capacitor and the common mode filter may be disposed in the support body and serve to protect the internal circuit from high-frequency noise and to remove the noise, thereby making it possible to more reliably transmit a signal.

In the present embodiments, it has been described that the interposer is disposed between substrates so as to connect electrical signals. However, the present disclosure is not necessarily limited thereto, but the interposer may connect a substrate and a chip set or connect a board and a board.

Although the preferred exemplary embodiments of the present disclosure have been described above, it is understood that the present disclosure may be modified in various forms, and those skilled in the art may practice various modified examples and changed examples without departing from the scope of the claims of the present disclosure.

The invention claimed is:

1. An interposer comprising:
a support body including a top surface and a bottom surface, at least a part of the support body disposed along the edge of a substrate;
a connection electrode configured to connect the top surface and bottom surface of the support body; and
a shielding member disposed at an outer surface of the support body wherein:
the support body is formed in a frame shape with an internal space therein;
the support body further comprises a reinforcement part for preventing the support body from deformation, and
the reinforcement part is connected to at least two spaced portions of the support body and disposed in the internal space of the support body.

2. The interposer of claim 1, wherein the support body is disposed along the edge of the substrate, as one part or a combination of two or more parts, selected from a group including:
a straight part disposed in a straight line shape along a part of the edge of the substrate;
a inclined part disposed in an inclined shape so as to be adjacent to a part of the edge of the substrate or a corner of the substrate; and
a curved part disposed in a round shape.

3. The interposer of claim 1, wherein the support body is formed of a ceramic material.

4. The interposer of claim 1, wherein the connection electrode is formed as a conductive material filled in a via hole formed through the support body in a thickness direction thereof to connect the top and bottom surfaces of the support body.

5. The interposer of claim 4, wherein the via holes are formed in two or more rows in the support body in a longitudinal direction thereof,
wherein the connection electrode filling the via holes comprises a signal line and a ground line disposed outside the signal line.

6. The interposer of claim 1, wherein the shielding member is formed of a conductive shielding material.

7. The interposer of claim 1, wherein the connection electrode is formed as a conductive material applied to the outer surface of the support body so as to connect the top and bottom surfaces of the support body.

8. The interposer of claim 1, wherein the connection electrode is formed as a conductive material filled in a via groove, the via groove formed in a recess shape at the outer surface of the support body, to connect the top surface and bottom surface of the support body.

9. The interposer of claim 8, wherein the via groove is formed by dividing a via hole formed through the support body in the thickness direction thereof or cutting the support body so as to open one side of the via hole.

10. The interposer of claim 8, wherein the connection electrode is formed through a process of forming a via hole through the support body in a thickness direction thereof, filling the via hole with a conductive material, and cutting the support body at the via hole.

11. The interposer of claim 8, wherein the shielding member is disposed at the outer surface of the support body so as to cover the connection electrode.

12. The interposer of claim 11, wherein the shielding member has a concave portion formed at the outer surface of the support body and configured to expose at least a part of an upper portion of the connection electrode abutting on the top surface of the support body, and a lower portion of the connection electrode abutting on the bottom surface of the support body.

13. The interposer of claim 8, wherein the support body is formed of a single-layered or multi-layered ceramic material.

14. The interposer of claim 1, wherein the support body comprises a decoupling capacitor or a bypass capacitor.

15. The interposer of claim 1, wherein the support body comprises a common mode filter.

16. The interposer of claim 1, wherein the reinforcement parts are integrated with the support body, and disposed in a lattice shape so as to cross each other in a straight line shape or curved line shape.

17. The interposer of claim 1, wherein the reinforcement parts are integrated with the support body, and irregularly formed in a curved shape so as to avoid parts mounted on the substrate.

* * * * *